United States Patent
Fujii

(10) Patent No.: US 8,309,920 B2
(45) Date of Patent: Nov. 13, 2012

(54) SAMPLE MILLING/OBSERVING APPARATUS AND METHOD OF OBSERVING SAMPLE

(75) Inventor: Akiko Fujii, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 1154 days.

(21) Appl. No.: 11/393,692

(22) Filed: Mar. 31, 2006

(65) Prior Publication Data

US 2006/0226376 A1    Oct. 12, 2006

(30) Foreign Application Priority Data

Apr. 7, 2005 (JP) .................................. 2005-111441

(51) Int. Cl.
*H01J 37/26* (2006.01)
(52) U.S. Cl. ............... 250/310; 250/311; 250/492.21
(58) Field of Classification Search .................. 250/310
See application file for complete search history.

(56) References Cited

U.S. PATENT DOCUMENTS

| | | | |
|---|---|---|---|
| 5,225,676 A * | 7/1993 | Matsuya | 250/311 |
| 6,067,164 A * | 5/2000 | Onoguchi et al. | 356/401 |
| 6,664,552 B2 * | 12/2003 | Shichi et al. | 250/492.21 |

FOREIGN PATENT DOCUMENTS

| | | |
|---|---|---|
| JP | 62-119847 | 6/1987 |
| JP | 06-020638 | 1/1994 |
| JP | 6-20638 | 1/1994 |
| JP | 07-230784 | 8/1995 |
| JP | 7-230784 | 8/1995 |
| JP | 07-272667 | 10/1995 |
| JP | 7-272667 | 10/1995 |
| JP | 09-223726 | 8/1997 |
| JP | 2000-100367 | 4/2000 |
| JP | 2001-210263 | 8/2001 |
| JP | 2005-005125 | 1/2005 |
| JP | 2005-135761 | 5/2005 |

OTHER PUBLICATIONS

Japanese Official Action—2005-111441—May 10, 2011.
Japanese Patent Office issued a Japanese Office Action date Jul. 27, 2010, Application No. 2005-111441.

* cited by examiner

*Primary Examiner* — Phillip A Johnston
(74) *Attorney, Agent, or Firm* — Young & Thompson

(57) ABSTRACT

When a sample is cut to update an observed section, an electron beam is focused on the observed section. An apparatus of the invention includes an ion gun 102 which irradiates an ion beam onto a sample 200 to form an observed section 202, an electron gun 104 which irradiates an electron beam EB onto the observed section 202 formed by the ion gun 102, a focal point adjusting unit 106 which adjusts a relationship between the observed section 202 and a focal point of the electron beam EB, and a focal point control unit 108 which controls the focal point adjusting unit 106 on the basis of an amount of cut of the sample 200 obtained by irradiation of the ion beam IB obtained by the ion gun 102.

17 Claims, 10 Drawing Sheets

(a)

(b)

(c)

SAMPLE MILLING/OBSERVING APPARATUS AND METHOD OF OBSERVING SAMPLE

This application is based on Japanese Patent application NO. 2005-111441, the content of which is incorporated hereinto by reference.

BACKGROUND

1. Technical Field

The present invention relates to a sample milling/observing apparatus including an ion gun which irradiates an ion beam on a sample to form a cross-section to be observed (hereinafter, to be referred to as observed section) and a method of observing a sample using the milling/observing apparatus for the sample.

2. Related Art

As an electronic microscope which observes a sample, a scanning electronic microscope (SEM) is known. When a sample is observed by the electronic microscope of this type, in general, the sample is placed on a predetermined stage, and an electron beam is focused on an observed surface of the sample in accordance with a tilt state of the observed surface. The electron beam is focused by changing a magnetic field of an object lens.

In this case, the stage is arranged to be able to be rotated in two axial directions. There is proposed an electronic microscope in which even though the tilt state of the observed surface of the sample changes with respect to the two axes, focusing of an electron beam is performed in accordance with the change of the tilt state (for example, see Japanese Laid-open patent publication NO. 2000-100367). In this electronic microscope, tilt angles of the axes are detected by an encoder, the magnetic field of the object lens is changed depending on the tilt angles to correct a focal point.

There is also proposed an electronic microscope in which currents of an object lens are changed in accordance with tilt states of observed surfaces of a sample having two observed surfaces (for example, see Japanese Laid-open patent publication NO. 2001-210263). In the electronic microscope, changed positions of tilts of the observed surfaces are calculated to change the current of the object lens such that the two observed surfaces are displayed by one image.

There is an observing method which performs a cutting operation to an observed section by focused ion beam milling (FIB) a plurality of times to continuously update the observed section. This observing method is used to make it possible to observe a change of the section in a cut direction of the sample.

However, even in the electronic microscope of any one of Japanese Laid-open patent publication NOS. 2000-100367 and 2001-210263, when an observed section is cut by an ion beam irradiated from an ion gun, an electron beam goes out of focus by an amount of cut. More specifically, in each of the electronic microscopes, focal correction is performed in accordance with a change of the sample in an tilt direction. For this reason, the electronic microscopes cannot cope with a case in which the observed section of the sample is cut to change the depth thereof. In this manner, each time the observed section is updated by the ion beam, the electron beam must be focused and make observation of the change of the section cumbersome.

SUMMARY OF THE INVENTION

According to the present invention, there is provided a sample milling/observing apparatus including: an ion gun which irradiates an ion beam onto a sample to form an observed section; an electron gun which irradiates an electron beam onto the observed section formed by the ion gun; a focal point adjusting unit which can adjust a relationship between the observed section and a focal point of the electron beam; and a focal point control unit which controls the focal point adjusting unit on the basis of an amount of cut of the sample obtained by irradiation of the ion beam obtained by the ion gun.

In the sample milling/observing apparatus, when the observed section is formed by irradiation of the ion beam obtained by the ion gun, by the focal point control unit the relationship between the observed section and the focal point of the electron beam is adjusted on the basis of the amount of cut of the sample obtained. In this manner, when the focal point of the electron beam is adjusted to the observed section before the irradiation of the ion beam, the focal point of the electron beam is automatically adjusted to a new observed section even after the irradiation of the ion beam.

According to the present invention, there is provided a method of observing a sample, including, when the sample is observed by using a sample milling/observing apparatus which includes an ion gun which irradiates an ion beam onto the sample and an electron gun which irradiates an electron beam onto the sample, cutting the sample by irradiation of the ion beam to form an observed section, adjusting a relationship between the observed section and a focal point of the electron beam on the basis of an amount of cut of the sample in the cutting; and irradiating the electron beam onto the observed section after the adjusting a focal point.

In the method of observing a sample, when the observed section is formed by irradiation of the ion beam obtained by the ion gun, the relationship between the observed section and the focal point of the electron beam is adjusted on the basis of an amount of cut of the sample. In this manner, when the focal point of the electron beam is adjusted to the observed section before irradiation of the ion beam, the focal point of the electron beam can be simply and easily adjusted to a new observed section even after the irradiation.

In the sample milling/observing apparatus according to the present invention, since a focal point of the electron beam is automatically adjusted to the observed section in accordance with cutting of the sample by the ion beam, adjustment of the focal point of the electron beam need not be manually performed each time the observed section is updated, and a change of the cross section of the sample can be simply and easily observed.

In the method of observing a sample according to the present invention, since a focal point of the electron beam is adjusted to the observed section on the basis of an amount of cut when the sample is cut by the ion beam, adjustment of the focal point of the electron beam can be appropriately performed when the observed section is updated, and a change of the section of the sample is advantageously observed.

BRIEF DESCRIPTION OF THE DRAWINGS

The above and other objects, advantages and features of the present invention will be more apparent from the following description taken in conjunction with the accompanying drawings, in which:

FIGS. 4A to 4C are end elevational views along a line A-A in FIG. 3 and shows an image displayed on a display, in which FIG. 4A shows an image in an initial state, FIG. 4B shows an image in a state obtained by cutting the sample in the initial state by a predetermined thickness of cut, and FIG. 4C shows an image in a state obtained by cutting the sample in the state in FIG. 4B by a predetermined thickness of cut.

DETAILED DESCRIPTION

Figure 1:
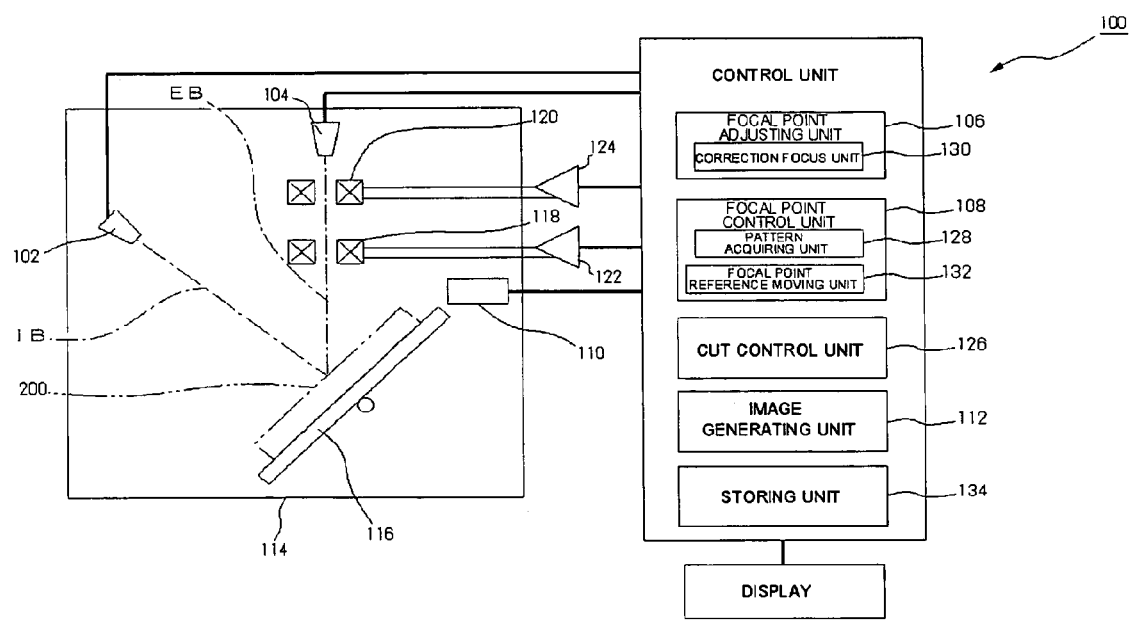
FIG. 1 is a schematic structural view of a sample milling/observing apparatus showing a first embodiment of the present invention.

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Referring to the drawings, preferred embodiments of a sample milling/observing apparatus and a method of observing a sample according to the present invention will be described below. The same reference numerals as in the drawings denote the same elements, and a repetitive description thereof will not be explained.

FIG. 1 is a schematic structural diagram of a sample milling/observing apparatus showing a first embodiment of the present invention.

As shown in FIG. 1, a sample milling/observing apparatus 100 includes an ion gun 102 which irradiates an ion beam IB onto a sample 200 to form an observed section 202 (see FIG. 2), an electron gun 104 which irradiates an electron beam EB onto the observed section 202 formed by the ion gun 102, a focal point adjusting unit 106 which adjusts a relationship between the observed section 202 and a focal point of the electron beam EB, and a focal point control unit 108 which controls the focal point adjusting unit 106 on the basis of an amount of cut of the sample 200 obtained by irradiation of the ion beam IB of the ion gun 102.

The sample milling/observing apparatus 100 includes a detecting unit 110 which detects a signal generated by irradiation of the electron beam EB onto the observed section 202 and an image generating unit 112 which generates an image of the observed section 202 on the basis of the signal detected by the detecting unit 110.

As shown in FIG. 1, the ion gun 102 and the electron gun 104 are arranged in the same chamber 114 and irradiate the ion beam IB and the electron beam EB toward the sample 200 placed on a stage 116, respectively. The stage 116 is a so-called eucentric tilt stage which can arbitrarily tilt the sample 200 within a predetermined range. A trajectory of the ion beam IB and a trajectory of the electron beam EB cross at a point having an almost eucentric height at which a height of the sample 200 does not change even though the stage 116 is rotated in a tilt direction. More specifically, at the same position of the sample 200, milling (or processing) and observation using the ion gun 102 and observation using the electron gun 104 can be performed.

The sample milling/observing apparatus 100 causes the ion gun 102 to irradiate the ion beam IB onto the sample 200 to cut the sample 200 by FIB. In this manner, the sample 200 is dug to form the observed section 202 to make it possible to expose an internal cross section of the sample 200. As an ion source of the ion beam IB, gallium ions are used. In the embodiment, a current value and a size of the ion beam IB are properly adjusted, and the apparatus detects secondary electrons or secondary ions generated on the surface of the sample 200 to also make it possible to two-dimensionally observe the observed section 202 as a scanning ion microscope (SIM).

The sample milling/observing apparatus 100 causes the electron gun 104 to irradiate the electron beam EB onto the sample 200 to detect secondary electrons or reflected electrons generated on the surface of the sample 200 by the detecting unit 110, thereby serving as an SEM to two-dimensionally observe the observed section 202. More specifically, as shown in FIG. 1, the sample milling/observing apparatus 100 has an object lens 118 to thinly converge the electron beam EB on the sample 200 and a polarizing lens 120 to cause the electron beam EB to scan on the observed section 202. Control amplifiers 122 and 124 are connected to the coil-shaped lenses 118 and 120, respectively. A magnetic field of the object lens 118 is changed to change a focal point of the electron beam EB. The object lens 118 is controlled by a correction focus unit 130 (will be described later) and used in a so-called dynamic focus function. In the sample milling/observing apparatus 100, not only surface observation which is a function of an SEM, but also surface observation which is a function of an SIM can be performed. Depending on an input operation by an operator, the observation by the SEM and the observation by the SIM are designed to be switched.

Figure 2:
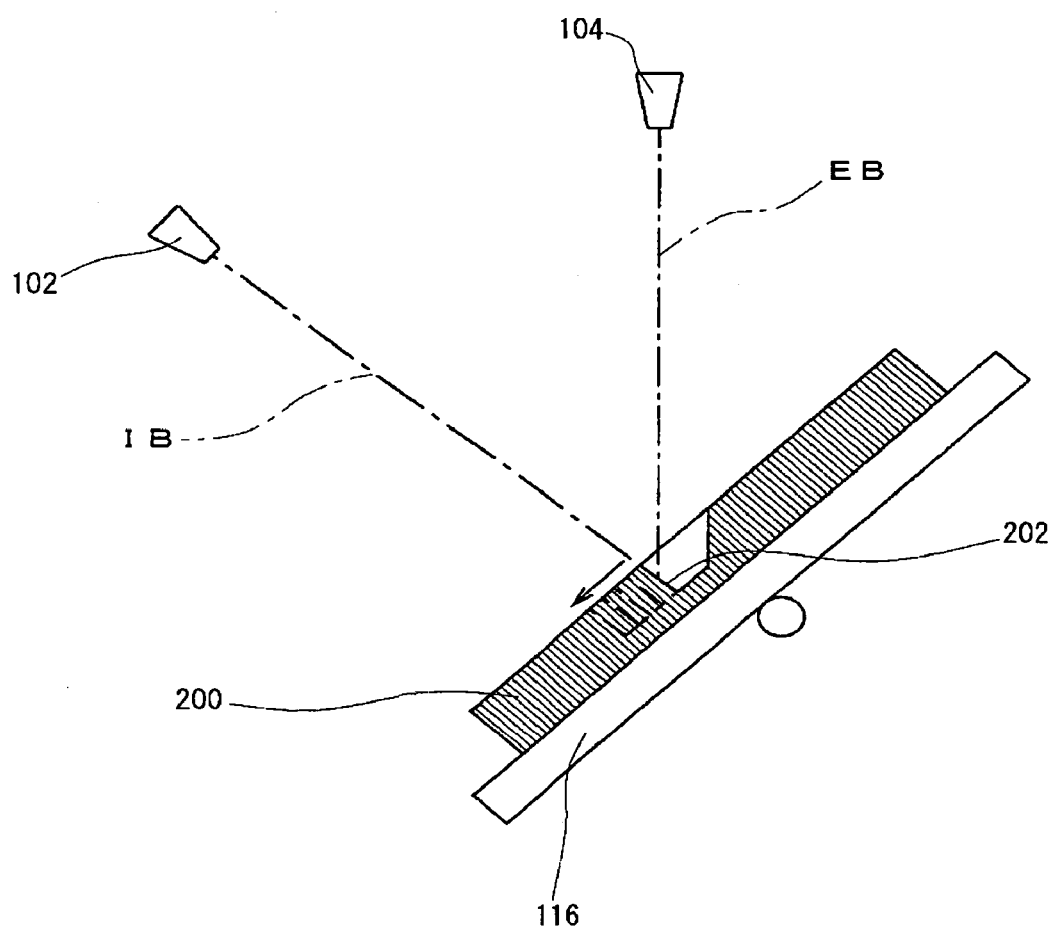
FIG. 2 is a diagram for explaining a cutting state of a sample obtained by an ion beam.

FIG. 2 is a diagram for explaining a cut state of a sample obtained by an ion beam.

As shown in FIG. 2, the ion gun 102 continuously cut the sample 200 in a predetermined cut direction a plurality of times. As shown in FIG. 1, the sample milling/observing apparatus 100 has a cut control unit 126 in which a preset cut pattern is stored. The ion gun 102 cuts the sample 200 by the ion beam on the basis of the cut pattern in the cut control unit 126.

In the embodiment, the sample 200 is a planar semiconductor device, and the ion beam IB is irradiated onto the sample 200 in a direction perpendicular to the sample 200 while tilting the sample 200. In this manner, a vertical cross-section of the sample 200 is exposed as the observed section 202. When the observed section 202 is gradually cut in a direction perpendicular to the section, that is to say, a direction of depth to make it possible to observe a change of the section in an in-plane direction. In the cut control unit 126, a vertical dimension and a horizontal dimension of the observed section 202 and a cut thickness d of each cut are stored as a cut pattern.

The focal point control unit 108 has a pattern acquiring unit 128 which acquires information about an amount of cut of the sample 200 from the cut pattern. The focal point control unit 108 adjusts a relationship between the observed section 202 and a focal point of the electron beam EB each time the sample 200 is cut.

In this case, the focal point adjusting unit 106 has a correction focus unit 130 which focuses the electron beam EB about a set reference point PS as a center in accordance with a tilt state of the observed section 202. When the sample 200 is observed while being tilted, the correction focus unit 130 suppresses the electron beam EB from going out of focus by a scanning position of the electron beam EB. As shown in FIGS. 1 and 2, the electron gun 104 is designed to vertically downwardly irradiate the electron beam EB. Unless the observed surface of the sample 200 is horizontal, focal correction must be performed by the correction focus unit 130. More specifically, the correction focus unit 130 changes a voltage applied to the control amplifier 122 of the object lens 118 in synchronism with scanning of the electron beam EB by the polarizing lens 120 to correct a focal point in accordance with the tilt of the observed section 202.

As shown in FIG. 1, the focal point control unit 108 has a focal point reference moving unit 132 which moves the set reference point PS of the correction focus unit 130 on the basis of the amount of cut of the sample 200 by irradiation of the ion beam IB obtained by the ion gun 102.

Figure 3:
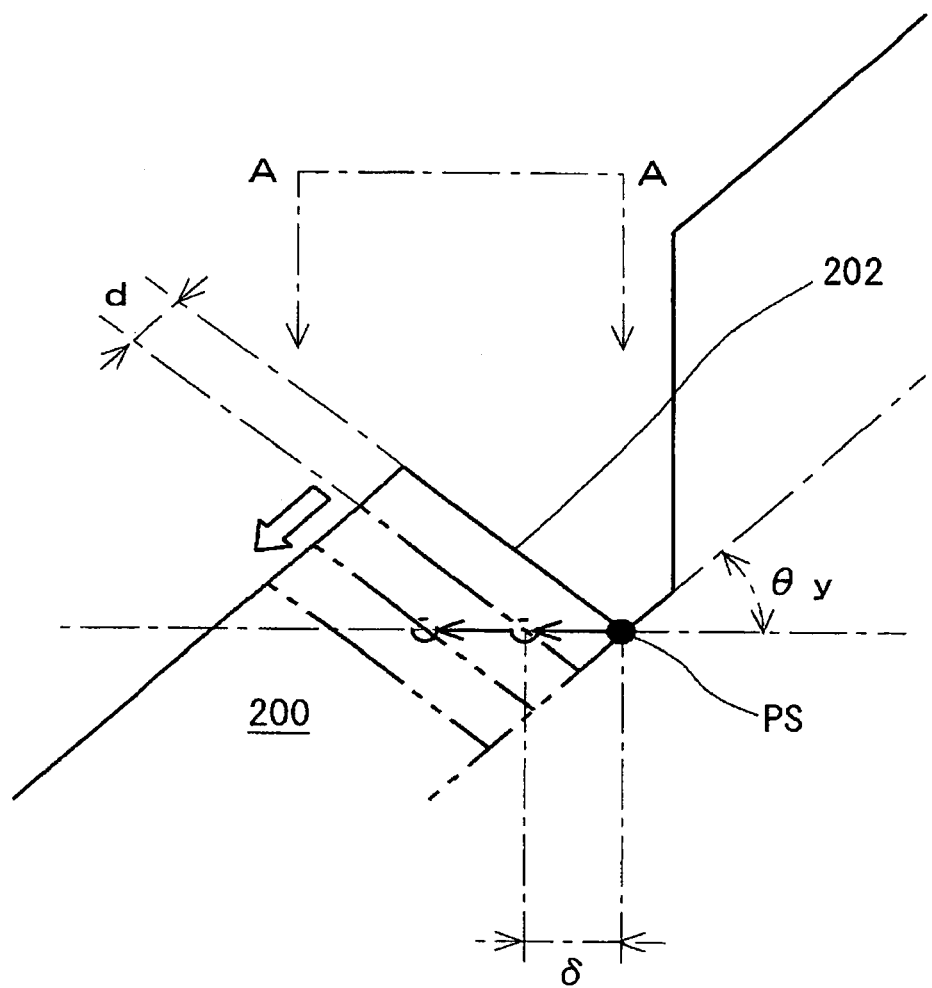
FIG. 3 is a diagram for explaining a state in which a set reference point moves in accordance with milling of a sample.
Figure 4A:
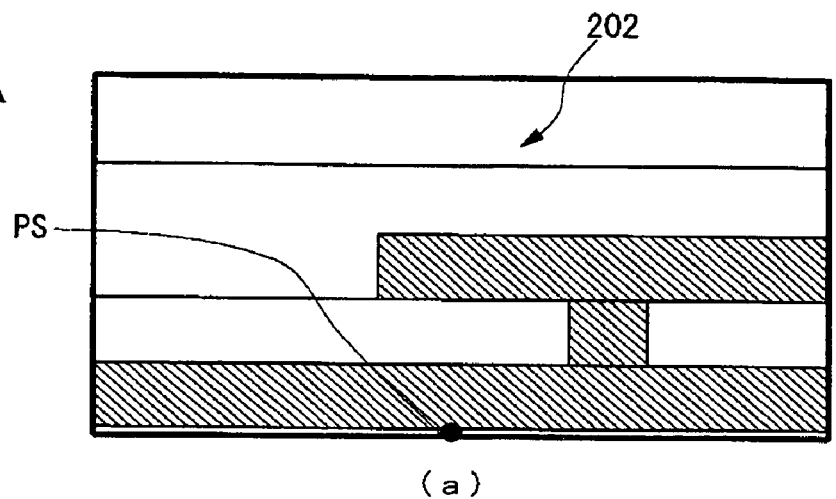
Figure 4B:
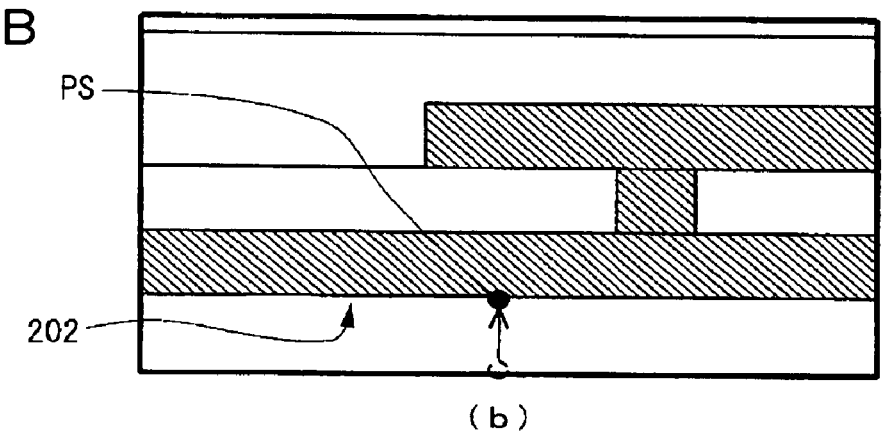
Figure 4C:
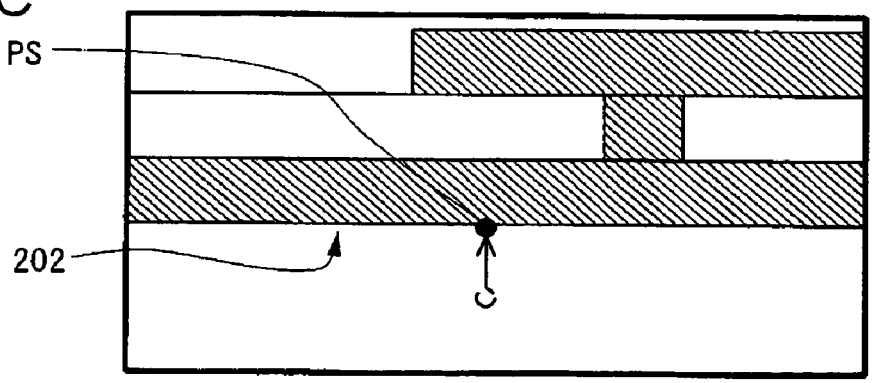

FIG. 3 is a diagram for explaining a state in which the set reference point moves in accordance with milling of the sample. FIGS. 4A to 4C show images displayed on a display, in which FIG. 4A shows an image in an initial state, FIG. 4B shows an image in a state obtained by cutting the sample in the initial state by a predetermined thickness of cut, and FIG. 4C shows an image in a state obtained by cutting the sample in the state in FIG. 4B by a predetermined thickness of cut.

The focal point reference moving unit 132 moves the set reference point PS to the same level as shown in FIG. 3 when the observed section 202 is cut. More specifically, the focal point reference moving unit 132 gradually moves the set reference point PS from the lower side to the upper side in the image as shown in FIG. 4. In this case, in the embodiment, a two-dimensional image of the observed section 202 obtained by the image generating unit 112 is displayed such that the upper surface side of the sample 200 and the lower surface side thereof face upward and downward, respectively. A display mode of the observed section 202 is changed by an installation state of the detecting unit 110. For example, the lower surface side of the sample 200 may face upward, the upper surface side of the sample 200 faces downward.

An example of a method of observing the sample 200 using the sample milling/observing apparatus 100 constituted as described above will be concretely described below.

The method of observing the sample 200 includes: the cutting step of cutting the sample 200 by irradiation of the ion beam IB to form the observed section 202; the focal point adjusting step of adjusting a relationship between the observed section 202 and a focal point of the electron beam EB on the basis of an amount of cut of the sample 200 in the cutting step; and the electron beam irradiating step of irradiating the electron beam EB onto the observed section 202 after the focal point adjusting step. In the embodiment, the focal point adjusting step includes the focal point reference moving step of moving a set reference point on the basis of the amount of cut of the sample 200.

The planar sample 200 is placed on the stage 116 having an almost horizontal placing unit. At this time, the sample 200 is placed on the stage 116 such that a sectional portion of the sample 200 on which the observed section 202 is formed has an eucentric height. As shown in FIG. 2, the stage 116 is tilted such that the sample 200 can be cut by the ion gun 102. In the embodiment, a tilt angle θy with respect to the horizontal direction of the stage 116 is about 50°.

After the sample 200 is tilted, the sample 200 is roughly cut by the ion beam IB in a state in which a current value of the ion gun 102 is relatively large. After the sample 200 is dug almost up to a section where a structure analysis is performed, the current value is decreased to perform cleaning of the section. In this manner, the observed section 202 suitable for observation by an SEM is formed.

In this state, a focal point of the electron beam EB on the observed section 202 is initially adjusted. In this case, as shown in FIG. 2, since the electron beam EB is vertically downwardly irradiated from the electron gun 104, the electron beam EB is incident on the observed section 202 at an angle of about 40° formed by the electron beam EB respect to the observed section 202. In this manner, when the electron beam EB scans the observed section 202 in the vertical direction of the observed section 202, the electron beam EB goes out of focus with respect to the observed section 202, the electron beam EB must be focused by the correction focus unit 130.

In the embodiment, as shown in FIG. 4A, a focusing operation performed by the correction focus unit 130 is performed such that the set reference point PS is the lowermost point in the image. The initial adjustment of the focal point may be performed by an automatic focus function or may be manually performed by an operation.

Upon completion of the initial adjustment of the focal point, observation of the sample 200 is started. An image of the observed section 202 in the initial state is acquired by an SEM to store image information in a storing unit 134. Thereafter, the observed section 202 is cut and updated by an FIB on the basis of a cut pattern stored in the cut control unit 126 (cutting step). When the observed section 202 is cut in such a state that the sample 200 is tilted, the distance between the observed section 202 and the electron gun 104 changes, and the electron beam EB goes out of focus at the set reference point PS of the correction focus unit 130 on the observed section 202.

In this case, when the observed section 202 is updated, as shown in FIG. 3, the set reference point PS of the correction focus unit 130 is moved by an amount of cut by means of the focal point reference moving unit 132 (focal point adjusting step). More specifically, the set reference point PS of the correction focus unit 130 on the observed section 202 which is not updated is moved onto the observed section 202 after the updating. That is, as shown in FIG. 4B, in the image of the observed section 202, the set reference point PS is moved upwardly. In this manner, at the moved set reference point PS, the electron beam EB is in focus.

In this case, when a thickness of cut of the sample 200 by FIB milling and a tilt angle formed between the stage 116 and the horizontal direction are represented by d and θy, respectively, a moving distance δ of the set reference point PS is calculated by the following equation $$\delta = d/\cos\theta_y$$

In this manner, since both the thickness of cut d and the tilt angle θy are known, the moving distance δ at which the electron beam EB is in focus on the updated observed section 202 is accurately calculated by the focal point reference moving unit 132.

Thereafter, the electron beam EB is irradiated on the observed section 202 (electron beam irradiating step), and an image of the observed section 202 in the initial state is acquired by an SEM and stored in the storing unit 134. At this time, since the tilt angle of the observed section 202 is not changed from the angle in the initial state, a correction rate of a current to the object lens 118 with respect to the tilt of the observed section 202 by the correction focus unit 130 need not be especially changed.

Thereafter, cutting of the observed section 202 by the FIB and acquisition of an image of the observed section 202 by the SEM are repeated a number of times stored in the cut pattern. More specifically, the cutting step, the focal point adjusting step, and the electron beam irradiating step are repeated more than once in the order named. In this manner, as shown in FIGS. 4B and 4C, a change of the cross section can be observed in the cut direction of the sample 200. As the cutting operation and the image acquiring operation of the observed section 202, the cutting operation may be performed after a predetermined operation is input when an operator is caused to check an image each time the observed section 202 is cut, or multiple cutting and multiple acquisition of images may be performed at once.

In order to facilitate understanding, the explanation has been performed by using the example in which a moving position of the set reference point PS is matched with the position of the pattern of the observed section 202. However, the moving position of the set reference point PS is generally determined by the thickness of cut d or the tilt angle θy. For this reason, the moving position is not always matched with the position of the pattern of the observed section 202.

In this manner, according to the sample milling/observing apparatus 100 of the embodiment, when the observed section 202 is observed by irradiation of the ion beam IB obtained by the ion gun 102, a relationship between the observed section 202 and a focal point of the electron beam EB is adjusted by the focal point control unit 108 on the basis of an amount of cut of the sample 200. In this manner, when the electron beam EB is focused on the observed section 202 before the irradiation of the ion beam IB, the electron beam EB is automatically focused on a new observed section 202 even after the irradiation.

Therefore, since the focal point of the electron beam EB on the observed section 202 is automatically adjusted in accordance with cutting of the sample 200 by the ion beam IB, adjustment of the focal point need not be manually performed each time the observed section 202 is updated, and a change of the section of the sample 200 can be simply and easily performed.

Since the focal point adjustment is performed on the basis of an amount of cut, adjustment need not be performed on the basis of a signal detected by the detecting unit 110 when the electron beam EB is irradiated on the observed section 202, and the focal point adjustment can be performed within a short period of time. Furthermore, the observed section 202 is in no danger of deformation caused by irradiation of the electron beam EB at the time of focal point adjustment, the apparatus is practically advantageous.

Since the set reference point PS of the existing correction focus unit 130 is moved, complex focal point adjustment need not be performed, and the object lens 118 can be simply and easily controlled. In particular, since the set reference point PS in the initial state is located on the back surface side of the sample 200 on the observed section 202, the set reference point PS may be merely moved on the upper surface side of the sample 200 each time the sample 200 is cut, and the set reference point PS is not out of the observed section 202 in accordance with milling of the sample 200. More specifically, an operator can check on a screen whether the electron beam EB is focused or not.

Figure 5:
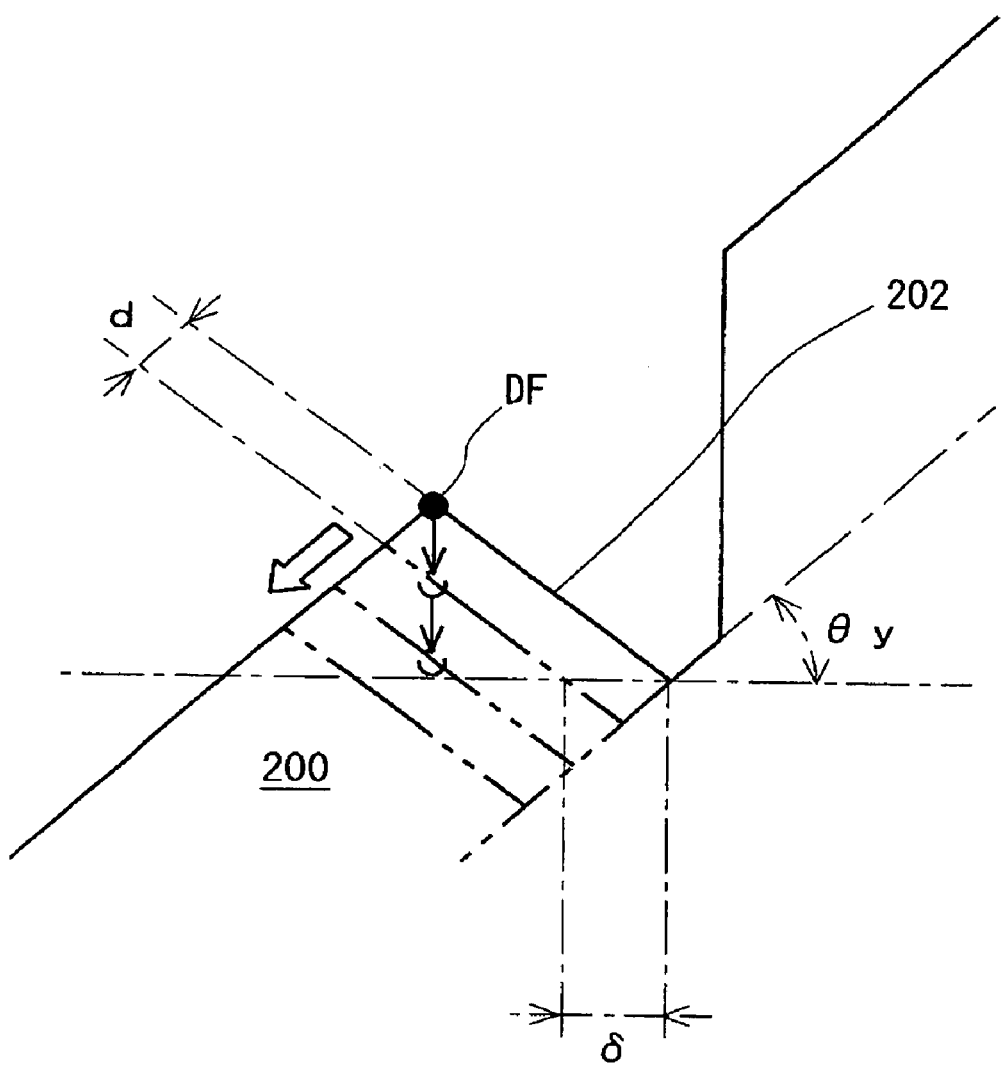
FIG. 5 shows a modification of the first embodiment, and is a diagram for explaining a state in which a focal position moves in accordance with milling of the sample.

In the first embodiment, the set reference point PS of the correction focus unit 130 is moved to perform focal point adjustment. However, a current value of the object lens 118 may be changed independently of the correction focus unit 130 to perform focal point adjustment. In this case, the focal point adjusting unit 106 has a position adjusting unit which adjusts a focal position DF of the electron beam EB, and the focal point adjusting unit 106 has a position changing unit which changes the focal position DF on the basis of an amount of cut of the sample 200 by the irradiation of the ion beam IB obtained by the ion gun 102. The focal point adjusting step includes a position changing step of changing the focal position DF on the basis of the amount of cut of the sample 200. FIG. 5 is a diagram for explaining an example in which focusing is performed by changing the focal position DF and shows a focusing operation in which the focal position DF is vertically downwardly moved.

In the first embodiment, the focal point control unit 108 has the pattern acquiring unit 128, and a cut pattern of the sample 200 is acquired to perform focal point adjustment. However, the focal point control unit 108 may have a comparing/acquiring unit which compares a signal detected by the detecting unit 110 before the cutting of the observed section 202 with a signal detected after the cutting of the observed section 202 to acquire information related to an amount of cut. In this case, for example, the focal point control unit 108 may compare image information generated by the image generating unit 112 before the cutting of the observed section 202 with image information generated after the cutting of the observed section 202 or compares the numbers of secondary electrons, reflected electrons, and the like emitted from the observed section 202 with each other. In this case, when the pieces of image information obtained before and after the cutting are compared with each other, the amount of cut may be calculated by a shift amount of an observing field in a generated image, or the amount of cut may be calculated by comparing contrasts of a gray scale.

Figure 6:
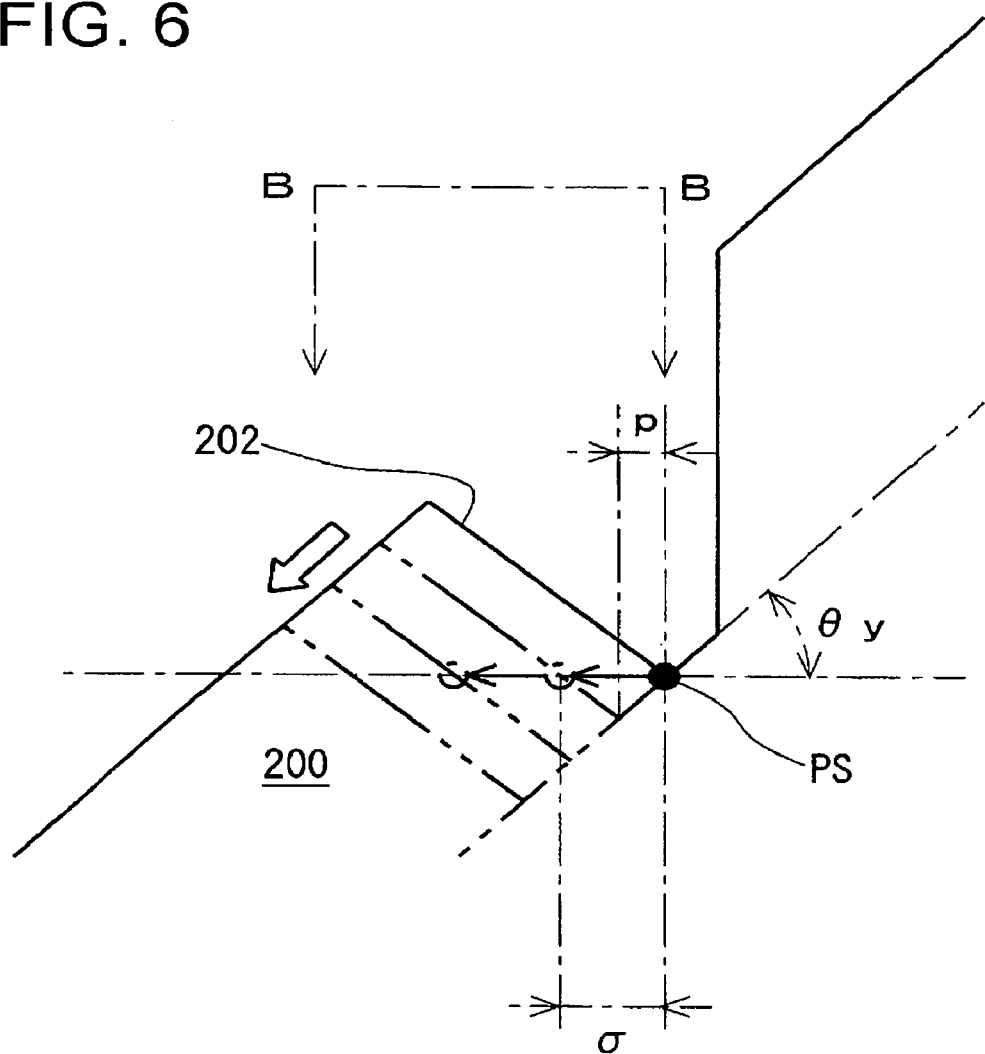
FIG. 6 shows a modification of the first embodiment, and is a diagram for explaining a state in which a set reference point moves in accordance with milling of the sample.
Figure 7:
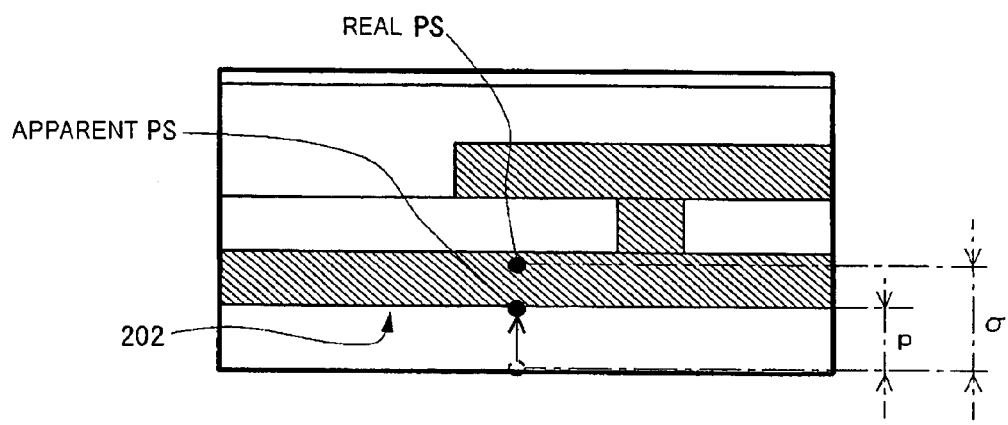
FIG. 7 is an end elevational view along a line B-B in FIG. 6 and shows an image displayed on a display and a state obtained by cutting a sample in an initial state by a predetermined thickness of cut.

In this case, with reference to FIGS. 6 and 7, a case in which the amount of cut is calculated by the shift amount of the observing field will be described below. FIGS. 6 and 7 show a modification of the first embodiment. FIG. 6 is a diagram for explaining a state in which a set reference point moves in accordance with milling of a sample, and FIG. 7 shows an image displayed on a display in a state obtained by cutting the sample by a predetermined thickness of cut in an initial state. As described above, with the advance of milling of the observed section 202, the observed section 202 moves upwardly in the image (see FIG. 7). At this time, when a length of upward movement of the observed section 202 is represented by p, the thickness of cut d is given by p/cos θy. For this reason, a length of correction δ of the set reference point PS is expressed by the following equation:

$$\delta = d/\cos\theta y = p/\cos^2\theta y$$

(see FIG. 6). In this manner, the length of correction δ can also be calculated from the shift amount of the observing field. A length of upward movement of the observed section 202 may be acquired by, for example, the length of movement of the set reference point PS on the screen as shown in FIG. 7, and the length of movement of a portion serving as a mark on the observed section 202 on the screen.

In this case, in the embodiment, the electron gun 104 is arranged vertically above the stage 116 while the ion gun 102 is arranged obliquely upward on the stage 116. However, the ion gun 102 may be arranged vertically above the stage 116 and the electron gun 104 may be arranged obliquely upward on the stage 116. The arrangement positions of the ion gun 102 and the electron gun 104 may be arbitrarily determined. In the first embodiment, the length of movement of the set reference point PS is calculated on the basis of a tilt angle θy of the sample 200 with respect to the horizontal direction of the stage 116. A sample milling/observing apparatus 100 in which a sample 200 is tilted to irradiate an electron beam EB from above is convenient because the tilt angle θy of the sample 200 can be easily monitored. However, when the electron beam EB is irradiated from oblique above and so on, in general, a length of movement of the set reference point PS may be calculated on the basis of an angle formed between the observed section 202 and the electron beam EB and the thickness of cut d.

Figure 8:
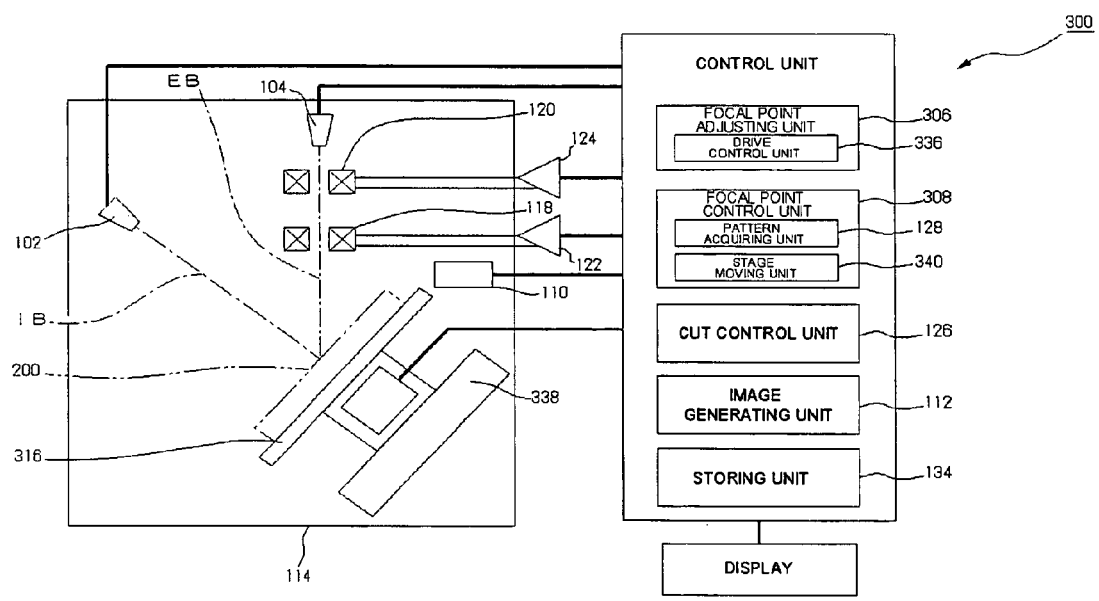
FIG. 8 is a schematic structural diagram of a sample milling/observing apparatus according to a second embodiment of the present invention.

FIG. 8 is a typical schematic diagram of a sample milling/observing apparatus showing a second embodiment of the present invention.

As shown in FIG. 8, a sample milling/observing apparatus 300 includes an ion gun 102 which irradiates an ion beam IB onto a sample 200 to form an observed section 202, an electron gun 104 which irradiates an electron beam EB onto the observed section 202 formed by the ion gun 102, a focal point adjusting unit 306 which can adjust a relative position between the observed section 202 and a focal point of the electron beam EB, and a focal point control unit 308 which controls the focal point adjusting unit 306 on the basis of an amount of cut of the sample 200 obtained by irradiation of the ion beam IB of the ion gun 102 to adjust the relative position.

The sample milling/observing apparatus 300 includes a detecting unit 110 which detects a signal generated by irradiation of the electron beam EB onto the observed section 202 and an image generating unit 112 which generates an image of the observed section 202 on the basis of the signal detected by the detecting unit 110.

In the sample milling/observing apparatus 300, a stage 316 is allowed to rotationally move in a tilt direction, to move in one direction (to be referred to as an X direction hereinafter) on a tilted plane, and to move in a direction (to be referred to as a Y direction hereinafter) perpendicular to the X direction on the tilted plane. The focal point adjusting unit 306 has a drive control unit 336 which moves the stage 316 on which the sample 200 is placed. More specifically, the stage 316 is moved in the X direction and the Y direction by using the drive control unit 336 to adjust the relative position between the observed section 202 and the focal point of the electron beam EB.

Figure 9:
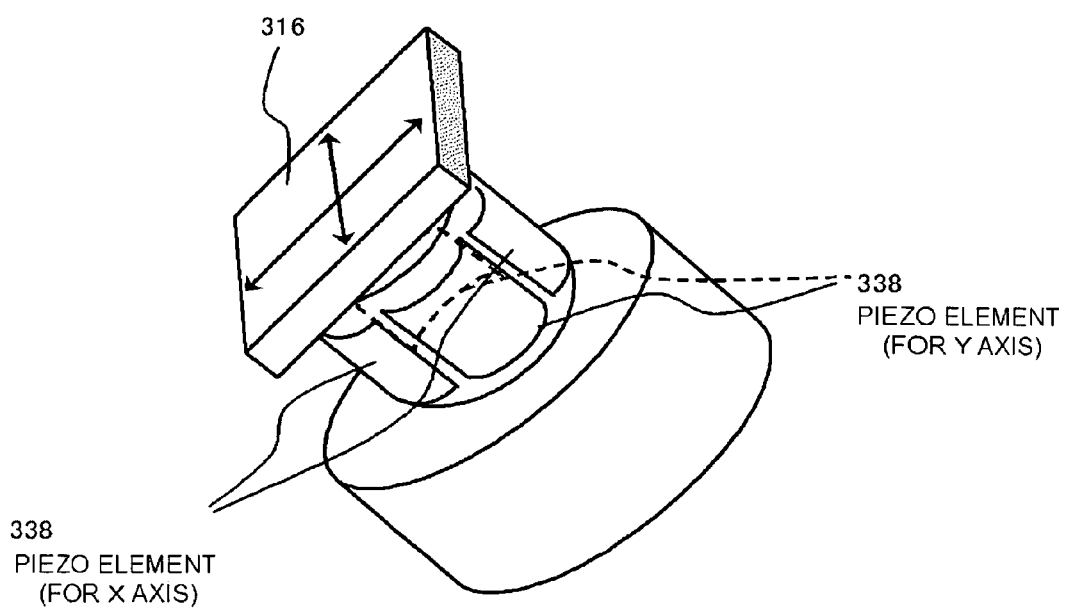
FIG. 9 is a schematic diagram for explaining a stage.

In the embodiment, the drive control unit 336 performs energizing control of a piezo element 338 arranged on the stage 316 side. In this case, FIG. 9 is a schematic diagram for explaining the stage. As shown in FIG. 9, the movements of the stage 316 in the X and Y directions are realized by extension and contraction of the piezo element 338, respectively.

The focal point control unit 308 has a pattern acquiring unit 128 which acquires information related to an amount of cut of the sample 200 from the cut pattern. The focal point control unit 308 adjusts the relative position by an amount of cut of the sample in the cut direction each time the sample 200 is cut.

The focal point control unit 308 has a stage moving unit 340 which moves the stage 316 by using the drive control unit 336 such that the relative position is maintained between the observed section 202 and the electron beam EB before and after the updating when the sample 200 is cut by irradiation of the ion beam IB to update the observed section 202.

An example of a method of observing the sample 200 by using the sample milling/observing apparatus 300 arranged as described above will be concretely described below.

The method of observing the sample 200 includes the cutting step of cutting the sample 200 by irradiation of the ion beam IB to form the observed section 202, the focal point adjusting step of adjusting a relative position between the observed section 202 and the focal point of the electron beam EB on the basis of an amount of cut of the sample 200 in the cutting step, and the electron beam irradiating step of irradiating the electron beam EB onto the observed section 202 after the focal point adjusting step.

As in the embodiment, the sample 200 is placed on the stage 316 such that a cross sectional portion of the sample 200 in which the observed section 202 has an eucentric height. As shown in FIG. 9, the stage 316 is tilted such that the sample 200 can be cut by the ion gun 102. After the sample 200 is tilted, the observed section 202 is formed by rough cutting by the ion gun 102 and cleaning of the section.

In this state, initial adjustment of a focal point of the electron beam EB on the observed section 202. In this case, since the electron beam EB is vertically downwardly irradiated from the electron gun 104, the electron beam EB is incident at an angle of about 40° formed between the electron beam EB and the observed section 202 (see FIG. 8). In this manner, when the electron beam EB is vertically scanned on the observed section 202, the electron beam EB goes out of focus on the observed section 202, and focusing is required to be performed by the correction focus unit 130 described above. In the embodiment, the position of the set reference point PS is arbitrarily set in the correction focus unit 130.

Upon completion of initial adjustment of the focal point, the sample 200 begins to be observed. An image of the observed section 202 in the initial state is acquired by an SEM, and image information is stored in the storing unit 134. Thereafter, the observed section 202 is cut and updated by an FIB on the basis of a cut pattern stored in the cut control unit 126 (cutting step). In a state in which the sample 200 is tilted, when the observed section 202 is cut, a distance between the observed section 202 and the electron gun 104 changes, so that the electron beam EB goes out of focus on the set reference point PS of the correction focus unit 130 on the observed section 202.

When the observed section 202 is updated, the stage 316 is moved by the stage moving unit 340 on the basis of an amount of cut (focal point adjusting step). In this manner, in the embodiment, the focal point adjusting step includes the stage moving step. More specifically, the stage 116 is approached to the electron gun 104 up to a position where the relative position between the observed section 202 and the electron gun 104 is not changed. In this manner, after the stage 116 moves, the electron beam EB is focused on the observed section 202.

At this time, since the stage 116 is controlled by energizing the piezo element 338, relatively minute movement in a nano-order level can be performed. Even though an amount of a cut by the ion beam IB is relatively minute in a nano-order level, the stage 116 can be properly moved.

Thereafter, the electron beam EB is irradiated onto the observed section 202 (electron beam irradiating step), the image of the observed section 202 in the initial state is acquired by the SEM, and image information is stored in the storing unit 134. At this time, since the tilt angle of the observed section 202 does not change from the initial state, a correction rate of a current to the object lens 118 with respect to a tile of the observed section 202 by the correction focus unit 130 need not be especially changed. Furthermore, since the relative position between the observed section 202 and the electron gun 104 does not change, the field of the image formed by the image generating unit 112 does not also change.

Thereafter, cutting of the observed section 202 by the FIB and acquisition of an image of the observed section 202 by the SEM are repeated a number of times stored in the cut pattern. In this manner, a change of the section of the sample 200 in the cut direction can be observed. As the cutting operation and the image acquiring operation of the observed section 202, the cutting operation may be performed after a predetermined operation is input when an operator is caused to check an image each time the observed section 202 is cut, or multiple cutting and multiple acquisition of images may be performed at once.

In this manner, also in the sample milling/observing apparatus 100 according to the embodiment, when the observed section 202 is formed by irradiation of the ion beam IB obtained by the ion gun 102, a relative position between the observed section 202 and the focal point of the electron beam EB is adjusted by the focal point control unit 308 on the basis of an amount of cut of the sample 200. In this manner, the electron beam EB is focused on the observed section 202 before the irradiation of the ion beam IB, the electron beam EB is automatically focused on a new observed section 202 even after the irradiation.

Therefore, since the focal point of the electron beam EB on the observed section 202 is automatically adjusted in accordance with cutting of the sample 200 by the ion beam IB, adjustment of the focal point of the electron beam EB need not be manually performed each time the observed section 202 is updated, and a change of the section of the sample 200 can be simply and easily performed.

Since the focal point adjustment is performed on the basis of an amount of cut, adjustment need not be performed on the basis of a signal detected by the detecting unit 110, thereby the focal point adjustment can be performed within a short period of time. Furthermore, the observed section 202 is in no danger of deformation caused by irradiation of the electron beam EB in focal point adjustment, the apparatus is practically advantageous.

Figure 10:
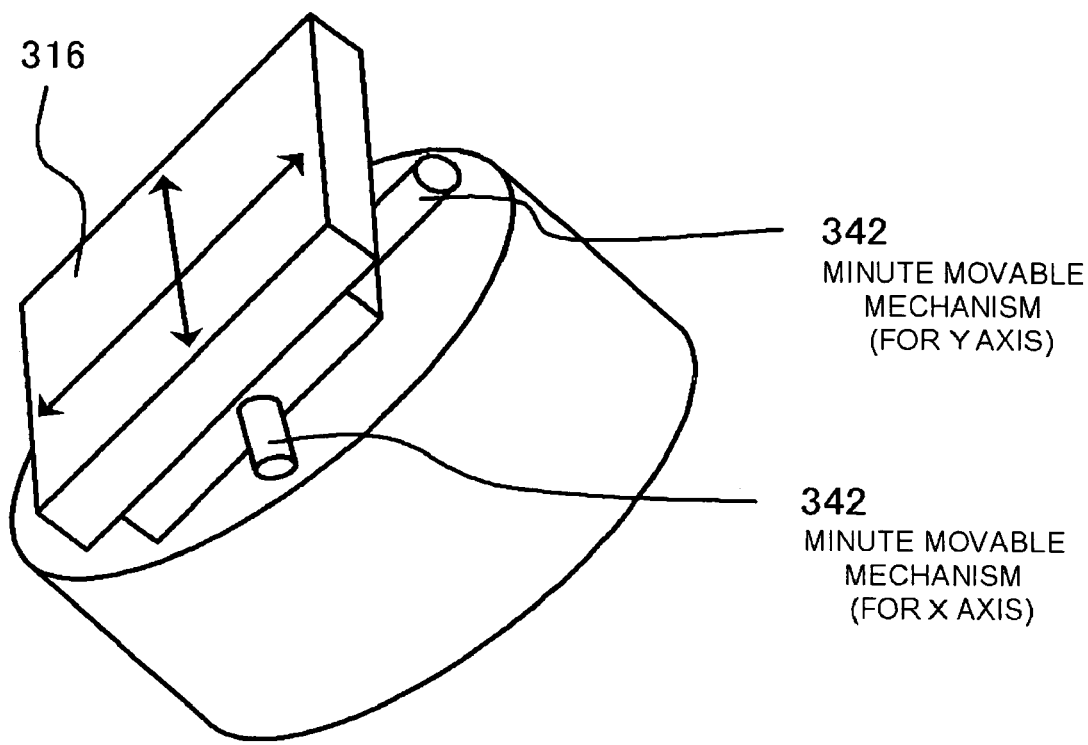
FIG. 10 is a schematic diagram for explaining a stage showing a modification.

In the explanation of the second embodiment, the stage 316 is driven by the piezo element 338. However, for example, as shown in FIG. 10, the stage 316 may be driven by using a minute movable mechanism 342 having a rotating shaft unit which moves in parallel the stage 316. Furthermore, the moving directions of the stage 316 are not limited to the X and Y directions. The stage 316 may be moved in a Z direction or may be moved toward the electron gun 104. When a relative position between the sample 200 and the focal point of the electron beam EB is maintained before and after the observed section 202 is updated, the configuration of the drive control unit 336 is not limited.

The focal point control unit 308 may have not only the stage moving unit 340 but also a unit, such as the focal point reference moving unit 132 in the first embodiment, which adjusts the focal point of the electron beam EB. In this case, for example, movement of the stage 316 and adjustment of the focal point of the electron beam EB may be alternatively selected depending on an amount of cut in milling of the sample 200, or the relative position of the observed section 202 and the electron beam EB may be adjusted by a cooperation between the movement and the adjustment.

The apparatus may further includes a comparing/acquiring unit which compares a signal detected by the detecting unit 110 before and after the cutting of the observed section 202 to acquire information related to an amount of cut. In addition, concrete detailed structures and the like can be arbitrarily changed as a matter of course.

It is apparent that the present invention is not limited to the above embodiment, and may be modified and changed without departing from the scope and spirit of the invention.

What is claimed is:

1. A sample milling/observing apparatus comprising:
an ion gun which irradiates an ion beam onto a sample to form an observed section;
a tiltable stage that tilts the sample within a predetermined range greater than zero;
an electron gun which irradiates an electron beam onto said observed section formed by said ion gun;
a focal point adjusting unit which can adjust a relationship between said observed section and a focal point of said electron beam; and
a focal point control unit which controls said focal point adjusting unit on the basis of an amount of cut of said sample obtained by irradiation of said ion beam obtained by said ion gun;
wherein said focal point adjusting unit and said focal point control unit are configured to automatically adjust said focal point of said electron beam to said observed section in accordance with said amount of cut of said sample such that a thickness of the cut d and a tilt angle formed between the stage and a horizontal direction θy determine a moving distance δ of a set reference point according to:

$$\delta = d/\cos \theta y.$$

2. The sample milling/observing apparatus according to claim 1,
wherein said focal point adjusting unit has a correction focus unit which focuses said electron beam about the set reference point as a center in accordance with a tilt state of said observed section, and
said focal point control unit has a focal point reference moving unit which moves said set reference point on the basis of the amount of cut of said sample by irradiation of said ion beam obtained said ion gun.

3. The sample milling/observing apparatus according to claim 1,
wherein said focal point adjusting unit has a position adjusting unit which adjusts a focal position of said electron beam, and
said focal point control unit has a position changing unit which changes said focal position on the basis of the amount of cut of said sample by the irradiation of said ion beam obtained the ion gun.

4. The sample milling/observing apparatus according to claim 1,
wherein said focal point adjusting unit has a drive control unit which moves said stage on which said sample is placed, and
said focal point control unit has a stage moving unit which moves said stage by using said drive control unit such that a relative position between said stage and said electron gun is maintained before and after updating when said sample is cut by irradiation of said ion beam to update said observed section.

5. The sample milling/observing apparatus according to claim 4,
wherein said drive control unit performs energizing control of a piezo element arranged on said stage side.

6. The sample milling/observing apparatus according to claim 1,
wherein said ion gun cuts said sample by said ion beam more than once,
said focal point control unit adjusts a relationship between said observed section and the focal point of said electron beam each time said sample is cut.

7. The sample milling/observing apparatus according to claim 1,
wherein said ion gun cuts said sample by said ion beam on the basis of a preset cut pattern,
said focal point control unit has a pattern acquiring unit which acquires information related to said amount of cut of said sample from said cut pattern.

8. The sample milling/observing apparatus according to claim 1, further comprising
a detecting unit which detects a signal generated by irradiation of said electron beam onto said observed section, and
wherein said focal point control unit has comparing/acquiring unit which compares a signal detected by said detecting unit before and after the cutting of the observed section to acquire information related to said amount of cut.

9. A method of observing a sample comprising:
placing the sample on a stage;
tilting the sample to a predetermined angle greater than zero;
when the sample is observed by a sample milling/observing apparatus including an ion gun which irradiates an ion beam onto said sample and an electron gun which irradiates an electron beam onto said sample,
cutting said sample by irradiation of said ion beam to form an observed section;
adjusting a relationship between said observed section and a focal point of said electron beam on the basis of an amount of cut of said sample in said cutting; and
irradiating said electron beam onto said observed section after said adjusting;
wherein said relationship between said observed section and said focal point of said electron beam is automatically adjusted so as to adjust said focal point of said electron beam to said observed section in accordance with said amount of cut of said sample such that a thickness of the cut d and a tilt angle formed between the stage and a horizontal direction θy determine a moving distance δ of a set reference point according to:

$\delta = d/\cos \theta y.$

10. The method of observing a sample according to claim 9,
wherein said sample milling/observing apparatus has a correction focus unit which focuses said electron beam about the set reference point as a center in accordance with a tilt state of said observed section, and
said adjusting includes moving said set reference point on the basis of the amount of cut of said sample.

11. The method of observing a sample according to claim 9, wherein
said sample milling/observing apparatus has a position adjusting unit which adjusts a focal position of said electron beam, and
said adjusting includes changing said focal position on the basis of the amount of cut of said sample.

12. The method of observing a sample according to claim 9,
wherein said sample milling/observing apparatus includes said stage on which said sample is placed and a drive control unit which moves said stage, and
said adjusting includes moving said stage by using said drive control unit such that a relative position between said stage and said electron gun is maintained before and after updating when said sample is cut by irradiation of said ion beam to update said observed section.

13. The method of observing a sample according to claim 9,
wherein said cutting, said adjusting, and said irradiating are repeated more than once in the order named.

14. The method of observing a sample according to claim 9,
wherein in said cutting, said ion gun cuts said sample by said ion beam on the basis of a preset cut pattern, and
in said adjusting, information related to said amount of cut of said sample is acquired from said cut pattern.

15. The method of observing a sample according to claim 9,
wherein said milling/observing apparatus includes a detecting unit which detects a signal generated by irradiation of said electron beam onto said observed section,
in said adjusting, a signal detected by said detecting unit is compared before and after the cutting of the observed section to acquire information related to said amount of cut.

16. The sample milling/observing apparatus according to claim 1,
wherein a length of upward movement of the observed section is represented by p, and a length of the moving distance δ of the set reference point is expressed by $\delta = d/\cos \theta y = p/\cos^2 \theta y.$ 17. The method of observing a sample according to claim 9,
wherein a length of upward movement of the observed section is represented by p, and a length of the moving distance δ of the set reference point is expressed by $\delta = d/\cos \theta y = p/\cos^2 \theta y.$

* * * * *